(12) United States Patent
Zhou (10) Patent No.: US 11,283,050 B2
(45) Date of Patent: Mar. 22, 2022

(54) DISPLAY PANEL, DISPLAY DEVICE, AND MANUFACTURING METHOD OF DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Weilong Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 581 days.

(21) Appl. No.: 16/333,810

(22) PCT Filed: Aug. 28, 2018

(86) PCT No.: PCT/CN2018/102772
§ 371 (c)(1),
(2) Date: Mar. 15, 2019

(87) PCT Pub. No.: WO2019/072041
PCT Pub. Date: Apr. 18, 2019

(65) Prior Publication Data
US 2021/0376295 A1    Dec. 2, 2021

(30) Foreign Application Priority Data
Oct. 10, 2017 (CN) .......................... 201710937180.X (51) Int. Cl.
*H01L 51/52* (2006.01)
*H01L 21/66* (2006.01)
(Continued)

(52) U.S. Cl.
CPC .......... *H01L 51/5265* (2013.01); *H01L 22/20* (2013.01); *H01L 27/3211* (2013.01); *H01L 51/5284* (2013.01); *H01L 51/56* (2013.01)

(58) Field of Classification Search
CPC . H01L 51/5265; H01L 22/20; H01L 27/3211; H01L 51/5284; H01L 51/56
See application file for complete search history.

(56) References Cited

U.S. PATENT DOCUMENTS

| 2004/0160172 A1* | 8/2004 | Tyan | ................... H01L 51/5265 313/506 |
| 2008/0211390 A1* | 9/2008 | D'Andrade | ......... H01L 51/5265 313/504 |

(Continued)

FOREIGN PATENT DOCUMENTS

| CN | 105098094 A | 11/2015 |
| CN | 107170901 A | 9/2017 |

(Continued)

OTHER PUBLICATIONS

Extended European Search Report dated Jul. 19, 2021; Appln. No. 18852770.9.

(Continued)

*Primary Examiner* — Karen Kusumakar
*Assistant Examiner* — Adam S Bowen (57) ABSTRACT

A display panel, a display device, and a manufacturing method of the display panel are disclosed. The display panel includes: a light emitting element including a microcavity structure and a light emitting layer disposed in the microcavity structure; and an external microcavity structure disposed on a light emitting side of the light emitting element and including a first transflective layer, a second transflective layer and a dielectric layer disposed between the first transflective layer and the second transflective layer. The microcavity structure can modulate a spectrum of light (Continued)

emitted by the light emitting layer in the first viewing angle range; the external microcavity structure can modulate a spectrum of light emitted by the light emitting element in the second viewing angle range; and the second viewing angle range is greater than the first viewing angle range.

20 Claims, 4 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 2014/0138662 A1* | 5/2014 | Goeoetz | H01L 51/56 257/40 |
| 2014/0225086 A1* | 8/2014 | Dobbertin | H01L 51/5268 257/40 |
| 2014/0319482 A1* | 10/2014 | Dobbertin | H01L 51/5262 257/40 |
| 2014/0353635 A1 | 12/2014 | Chou et al. | |
| 2015/0333107 A1 | 11/2015 | Gee et al. | |
| 2016/0118612 A1* | 4/2016 | Park | H01L 51/5278 257/40 |
| 2017/0125496 A1* | 5/2017 | Oh | H01L 27/3211 |
| 2017/0250376 A1 | 8/2017 | Sasaki | |

FOREIGN PATENT DOCUMENTS

| | | |
|---|---|---|
| CN | 207320172 U | 5/2018 |
| KR | 1020110108271 A | 10/2011 |
| TW | 201445723 A | 12/2014 |

OTHER PUBLICATIONS

International Search Report and Written Opinion dated Nov. 28, 2018; PCT/CN2018/102772.

* cited by examiner

DISPLAY PANEL, DISPLAY DEVICE, AND MANUFACTURING METHOD OF DISPLAY PANEL

The present application claims the benefits of Chinese patent application No. 201710937180.X, which was filed on Oct. 10, 2017 and is fully incorporated herein by reference as part of the present application.

TECHNICAL FIELD

Embodiments of the present disclosure relate to a display panel, a display device, and a manufacturing method of the display panel.

BACKGROUND

Organic light emitting diode (OLED) displays have become the hotspot of research because of advantages such as self-luminescence, high contrast, low thickness, wide viewing angle, fast response speed, flexibility and wide usage temperature range. The OLED displays are considered as the next-generation display technology after liquid crystal display (LCD).

An OLED generally includes an anode, a cathode and an organic electroluminescent unit disposed between the two electrodes. The organic electroluminescent unit at least includes a hole transport layer (HTL), a light emitting layer and an electron transport layer (ETL). Semiconductor microcavity is an optical structure for spectrum narrowing, and photons generated in the light emitting layer are confined in a cavity formed by two mirror surfaces; an organic layer of the OLED is also sandwiched between the two electrodes; and an optical thickness of the organic layer is almost on the same magnitude as the light wavelength. Therefore, the luminous characteristics of the OLED not only depend on the inherent characteristics of the OLED material itself, but also can utilize the anode and the cathode to form a, thereby generating a microcavity effect on the luminous characteristics, such that the light emitted by the light emitting layer forms strong interference of multiple beams in the cavity, thereby narrowing the emission spectrum and modulating the peak wavelength of the emission spectrum.

SUMMARY

At least an embodiment of the present disclosure provides a display panel, including: a light emitting element, including a microcavity structure and a light emitting layer disposed in the microcavity structure; and an external microcavity structure, disposed on a light emitting side of the light emitting element and including a first transflective layer, a second transflective layer and a dielectric layer disposed between the first transflective layer and the second transflective layer, wherein the microcavity structure is configured to modulate a spectrum of light emitted by the light emitting layer in a first viewing angle range; the external microcavity structure is configured to modulate a spectrum of light emitted by the light emitting element in a second viewing angle range; and the second viewing angle range is larger than the first viewing angle range.

For example, in the display panel provided by an embodiment of the present disclosure, a cavity length of the microcavity structure of the light emitting element is different from a cavity length of the external microcavity structure.

For example, in the display panel provided by an embodiment of the present disclosure, the microcavity structure of the light emitting element is configured to narrow the spectrum of the light emitted by the light emitting layer in the first viewing angle range; and the external microcavity structure is configured to narrow the spectrum of the light emitted by the light emitting element in the second viewing angle range.

For example, in the display panel provided by an embodiment of the present disclosure, a distance between the external microcavity structure and the microcavity structure is greater than 1000 nm.

For example, in the display panel provided by an embodiment of the present disclosure, the light emitting element further includes a first electrode and a second electrode; the first electrode and the second electrode are disposed on both sides of the light emitting layer and configured to drive the light emitting layer to emit light; and at least one of the first electrode or the second electrode is a reflective electrode so as to form the microcavity structure.

For example, the display panel provided by an embodiment of the present disclosure further including: a first antireflection film, disposed between the external microcavity structure and the light emitting element.

For example, in the display panel provided by an embodiment of the present disclosure, the first antireflection film includes: a first line polarizer and a first quarter-wave plate which are stacked, wherein the first line polarizer is disposed on a side of the first antireflection film close to the light emitting element.

For example, the display panel provided by an embodiment of the present disclosure further including: a second antireflection film, disposed on a side of the external microcavity structure away from the light emitting element.

For example, in the display panel provided by an embodiment of the present disclosure, the second antireflection film further includes: a second line polarizer and a second quarter-wave plate which are stacked, wherein the second line polarizer is disposed on a side of the second antireflection film away from the light emitting element; and a polarization direction of the first line polarizer is the same with a polarization direction of the second line polarizer.

For example, in the display panel provided by an embodiment of the present disclosure, the light emitting layer includes an organic light emitting layer or an inorganic light emitting layer.

For example, in the display panel provided by an embodiment of the present disclosure, the light emitting element includes a plurality of light emitting elements, the plurality of light emitting elements being configured to respectively emit light of different colors; and the external microcavity structure includes a plurality of sub external microcavity structures in one-to-one correspondence with the plurality of light emitting elements of different colors so as to respectively modulate spectrums of light emitted by the plurality of light emitting elements of different colors.

For example, in the display panel provided by an embodiment of the present disclosure, the light emitting element includes: a first color light emitting element, a light emitting layer of the first color light emitting element being configured to emit light of a first color; a second color light emitting elements, a light emitting layer of the second color light emitting element being configured to emit light of a second color; and a third color light emitting element, a light emitting layer of the third color light emitting element being configured to emit light of a third color, the external microcavity structure comprises a first external microcavity structure corresponding to the first color light emitting element, a second external microcavity structures corresponding to the second color light emitting element, and a third external microcavity structure corresponding to the third color light emitting element.

For example, in the display panel provided by an embodiment of the present disclosure, a material of at least one of the first transflective layer or the second transflective layer includes aluminum.

For example, in the display panel provided by an embodiment of the present disclosure, a thickness of the first transflective layer is 3-7 nm, and a thickness of the second transflective layer is 3-7 nm.

For example, in the display panel provided by an embodiment of the present disclosure, a thickness range of the dielectric layer is 300-800 nm.

At least an embodiment of the present disclosure provides a display device, including any one of abovementioned display panels.

At least an embodiment of the present disclosure provides a manufacturing method of a display panel, wherein the display panel is any one of abovementioned display panels; and the manufacturing method includes: measuring a color shift condition of the light emitting element in the second viewing angle range; and setting a distance between the first transflective layer and the second transflective layer according to the color shift condition.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the invention apparent, technical solutions according to the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly.

At present, with the continuous development of display technology, people have higher and higher requirements on the performances of display devices. For example, people would require a display device to have good viewing experience at different viewing angles. However, inventor(s) of the present application have found in the research that conventional organic light emitting diode (OLED) display devices may have severe color shift at different viewing angles, thereby affecting the viewing experience.

Figure 1:
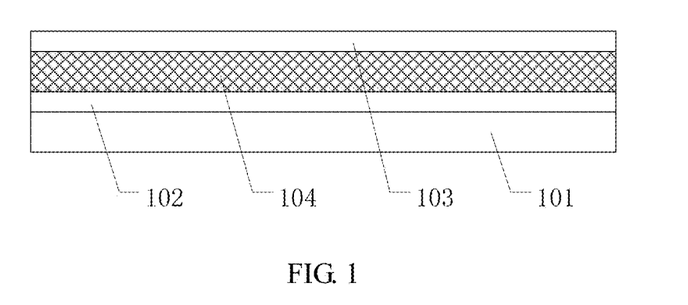
FIG. 1 is a schematic structural view of a display panel.

FIG. 1 is a schematic structural view of a display panel. As shown in FIG. 1, the display panel comprises a base substrate 101, an anode 102, a cathode 103 and a light emitting layer 104 disposed between the anode 102 and the cathode 103. A microcavity can be formed by arranging a reflective layer and a transflective layer in the display panel. For example, a microcavity can be formed by setting the anode 102 as a reflective electrode and the cathode 103 as a transflective electrode, thereby generating a microcavity effect on light emitted by the light emitting layer 104. Thus, the light emitted by the light emitting layer 104 can form strong interference of multiple beams, so that density of photons of different energy states can be redistributed, and then spectrum of the light emitted by the light emitting layer 104 can change. By adjusting a distance between the reflective layer and the transflective layer, light of a specific wavelength or a specific wavelength range can be enhanced and light at other wavelengths can be weakened, so that the spectrum of the light emitted by the light emitting layer 104 can be narrowed. As shown in FIG. 1, upon an observer viewing from a certain viewing angle, because the distance between the reflective layer and the transflective layer at the viewing angle will change, the spectrum of the light emitted by the light emitting layer 104 will change, thereby generating color shift phenomenon. In addition, the OLE-D display device can adopt a single-layer or multi-layer capping layer (CPL) which is then deposited on the cathode to improve the external quantum efficiency (EQE) or change the chrominance. However, because the refractive index of the CPL is greatly different from that of the cathode, an interface of both will have certain reflective function, and the CPL functions as a reflector together with the cathode. Therefore, although the CPL can improve the EQE, the color shift can be increased.

Embodiments of the present invention provide a display panel, a display device and a manufacturing method of the display panel. The display panel include: a light emitting element including a microcavity structure and a light emitting layer arranged in the microcavity structure; and an external microcavity structure disposed on a light emitting side of the light emitting element and including a first transflective layer, a second transflective layer and a dielectric layer disposed between the first transflective layer and the second transflective layer. The microcavity structure can modulate a spectrum of light emitted by the light emitting layer in a first viewing angle range. The external microcavity structure can modulate a spectrum of light emitted by the light emitting element in a second viewing angle range. The second viewing angle range is greater than the first viewing angle range. Therefore, the display panel can reduce the color shift within a large viewing angle range, and then can improve the display quality.

Hereinafter, the display panel, the display device and the manufacturing method of the display panel provided by the embodiments of the present invention will be described with reference to the accompanying drawings.

Figure 2:
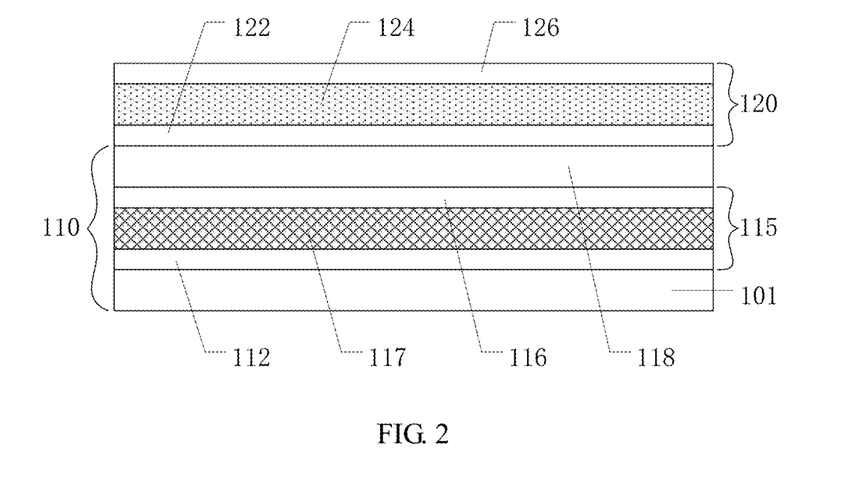
FIG. 2 is a schematic structural view of a display panel provided by an embodiment of the present disclosure.

At least an embodiment of the present invention provides a display panel. FIG. 2 is a schematic structural view of the display panel provided by an embodiment of the present invention. As shown in FIG. 2, the display panel includes a light emitting element 110 and an external microcavity structure 120 disposed on a light emitting side of the light emitting element 110. The light emitting element 110 includes a microcavity structure 115 and a light emitting layer 117 disposed in the microcavity structure 115. The external microcavity structure 120 includes a first transflective layer 122, a second transflective layer 126 and a dielectric layer 124 disposed between the first transflective layer 122 and the second transflective layer 126. The microcavity structure 115 can modulate a spectrum of light emitted by the light emitting layer 117 in a first viewing angle range, For example, enhancing light of a specific wavelength or a specific wavelength range and weakening light of other wavelengths, thereby narrowing the spectrum of the light emitted by the light emitting layer 117. The external microcavity structure 120 can modulate a spectrum of light emitted by the light emitting element 110 in a second viewing angle range. Moreover, the second viewing angle range is greater than the first viewing angle range. It should be noted that the first viewing angle range and the second viewing angle range refer to a range of an angle formed by a sight line and a normal line of the display panel; and the description that the second viewing angle range is greater than the first viewing angle range refers to that the angle formed by the sight line and the normal line of the display panel in the second viewing angle range is greater than the angle formed by the sight line and the normal line of the display panel in the first viewing angle range.

In the display panel provided by the embodiment, in the first viewing angle range, the microcavity structure 115 generates microcavity effect on the light emitted by the light emitting layer 117, so as to modulate the spectrum of the light emitted by the light emitting layer 117. In this case, upon the display panel being observed in the first viewing angle range, there is no color shift phenomenon. In the second viewing angle range, due to the increase of the angle formed by the sight line and the normal line of the display panel in the second viewing angle range, the distance between the reflective layer and the transflective layer in the microcavity structure 115 changes, so the modulation effect of the spectrum of the light emitted by the light emitting layer 117 will change. In this case, the additionally arranged external microcavity structure 120 can modulate the spectrum of light emitted by the light emitting element 110 in the second viewing angle range again, thereby reducing and even eliminating color shift. Therefore, the display panel can reduce the color shift within a large viewing angle range (at least in the first viewing angle range and the second viewing angle range) and then can improve the display quality.

For example, upon the display panel displaying white (W) color, the tristimulus values XYZ change because the spectrum of RGB colors at different viewing angles are different, so the tristimulus values Xw, Yw, Zw of the W color formed by the mixture of the RGB colors change, and then color shift can be caused. Because the microcavity effect of the microcavity structure, the luminance decay (L-Decay) curve of the display panel is no longer in line with a Lambert radiator, so the tendencies of the L-Decays curves of the RGB colors are not consistent again, and then color shift can be caused. For example, upon luminance of blue (B) color is reduced compared with red and green (RG) colors, the white image will be yellowish. In this case, the Z stimulus value is reduced, and meanwhile, the chromaticity coordinate (X, Y) will be increased. In this case, the L-Decay curve of B color can be adjusted through the external microcavity structure, and the tristimulus values X, Y, Z can be balanced, and then the color shift of the display panel can be improved. The L-Decay curve of red (R) color, the L-Decay curve of green (G) color and the L-Decay curve of B color can be respectively and correspondingly adjusted by the adjustment of the distance between the first transflective layer and the second transflective layer of the external microcavity structure, namely the cavity length of the external microcavity structure, thereby responding to various color shift phenomena. In addition, as the external microcavity structure is independent of the light emitting element, the cavity length of the external microcavity structure can be flexibly adjusted, and then the color shift of the display panel can be flexibly improved. It should be noted that, the cavity length of the external microcavity structure is equivalent to a product of a refractive index of the dielectric layer and the distance between the first transflective layer and the second transflective layer of the external microcavity structure.

It should be noted that: in 1931, the Commission Internationale de L'Eclairage (CIE) theoretically assumed three primary colors that do not exist in nature, namely the theoretical three primary colors, represented by X, Y, Z, forming a XYZ colorimetric system. X primary color is equivalent to reddish violet with higher saturation than spectruml red; Y primary color is equivalent to green with higher saturation than 520 nm; and Z primary color is equivalent to blue with higher saturation than 477 nm. The stimuli amounts of the three theoretical primary colors are represented by X, Y, Z, namely the so-called tristimulus values. The calculation method of the three stimulation values may refer to the following formula:

$$X=\int_{380}^{780} \bar{x}(\lambda)\Phi(\lambda)d\lambda,\ Y=\int_{380}^{780} \bar{y}(\lambda)\Phi(\lambda)d\lambda,\\ Z=\int_{380}^{780} \bar{z}(\lambda)\Phi(\lambda)d\lambda$$

in which $\bar{x}(\lambda)$, $\bar{y}(\lambda)$, $\bar{z}(\lambda)$ refer to the tristimulus values of the spectrum; and $\Phi(\lambda)$ refers to the spectrum.

In addition, the chromaticity coordinate of CIE1931 can be represented by (x, y). The calculation method of (x, y) is x=X/(X+Y+Z), y=Y/(X+Y+Z), z=Z/(X+Y+Z).

For example, in the display panel provided by the embodiment, the cavity length of the microcavity structure is different from the cavity length of the external microcavity structure, so it is guaranteed that the external microcavity structure can modulate the spectrum of the light emitted by the light emitting element in the second viewing angle range.

For example, in some examples, the first viewing angle may be 0°-20°, and the second first viewing angle may be 20°-60°.

For example, in some examples, the microcavity structure can narrow the spectrum of the light emitted by the light emitting layer in the first viewing angle range, and the external microcavity structure can narrow the spectrum of the light emitted by the light emitting element in the second viewing angle range.

For example, in some examples, the distance between the external microcavity structure and the microcavity structure is greater than 1000 nm. Thus, the distance between the external microcavity structure and the microcavity structure is greater than the wavelength scale of visible light, thereby ensuring that other microcavity structures cannot be formed between the external microcavity structure and the microcavity structure and avoiding the adverse effects of the formed other microcavity structures on the improvement of the color shift of the display panel.

For example, in some examples, a material of at least one of the first transflective layer or the second transflective layer includes aluminum, so that the first transflective layer or the second transflective layer can have good reflectivity.

For example, in some examples, a thickness range of the first transflective is 3-7 nm, and a thickness of the second transflective layer is 3-7 nm.

For example, a thickness of the first transflective may be set to be 5 nm, and the thickness of the second transflective layer may be set to be 5 nm.

For example, in some examples, a thickness range of the dielectric layer is 300-800 nm. Thus, the optical thickness of the dielectric layer and the light wavelength can be on the same magnitude, so that the external microcavity structure can generate microcavity effect on the light emitted by the light emitting element.

For example, in some examples, the light emitting element further includes a first electrode and a second electrode; the first electrode and the second electrode are disposed on both sides of the light emitting layer and can drive the light emitting layer to emit light; and the first electrode or the second electrode is a reflective electrode so as to form the microcavity structure.

For example, as shown in FIG. 2, the first electrode 112 is a reflective electrode and the second electrode 116 is a transflective electrode. The first electrode may be made from reflective materials such as silver and aluminum, to form the reflective electrode; and the second electrode may be formed by a multi-layer structure to form the transflective electrode, thereby forming the microcavity structure. For example, the multi-layer structure includes transparent metal oxide and a thin-film metal layer. For example, the transparent metal oxide may be indium tin oxide (ITO), and the thin-film metal layer adopts certain thickness to not only realize partial transmission but also realize partial reflection. The multi-layer structure can reduce sheet resistance and then be used as an electrode.

Of course, the embodiment of the present invention includes but not limited thereto. The first electrode may be a transflective electrode and the second electrode may be a reflective electrode.

For example, in some examples, the first electrode is an anode and the second electrode is a cathode, or the first electrode is a cathode and the second electrode is an anode.

For example, in some examples, as shown in FIG. 2, the light emitting element 110 further includes an encapsulated layer 118 disposed on a side of the second electrode 116 away from the first electrode 112. The encapsulated layer 118 can prevent elements in the air such as moisture and oxygen from eroding the first electrode, the second electrode and the light emitting layer disposed between the first electrode and the second electrode, and then prolong the service life of the light emitting element.

For example, in some examples, as shown in FIG. 2, the light emitting element 110 further includes a base substrate 101, and the first electrode 112 is disposed on the base substrate 101.

For example, the base substrate may adopt a quartz substrate, a sapphire substrate, a glass substrate or a plastic substrate.

For example, in some examples, the light emitting layer may include a red light emitting layer, a green light emitting layer and a blue light emitting layer.

For example, in some examples, the light emitting layer includes an organic light emitting layer or an inorganic light emitting layer.

Figure 3:
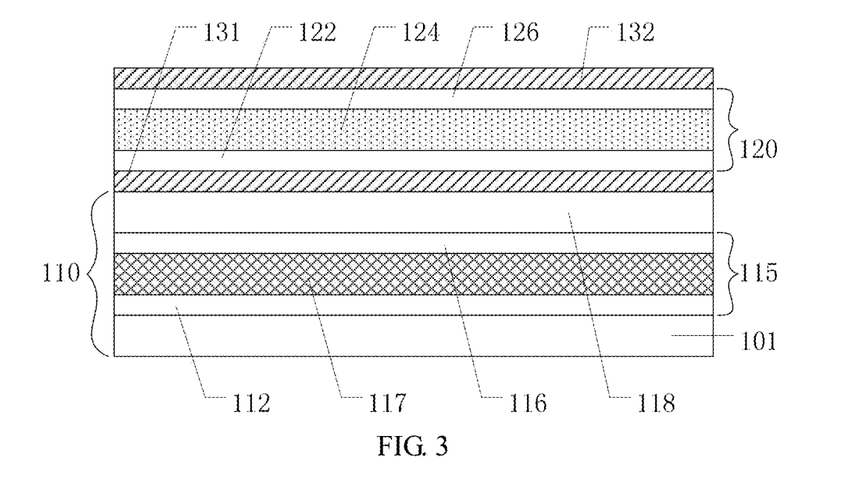
FIG. 3 is a schematic structural view of another display panel provided by an embodiment of the present disclosure.
Figure 4:
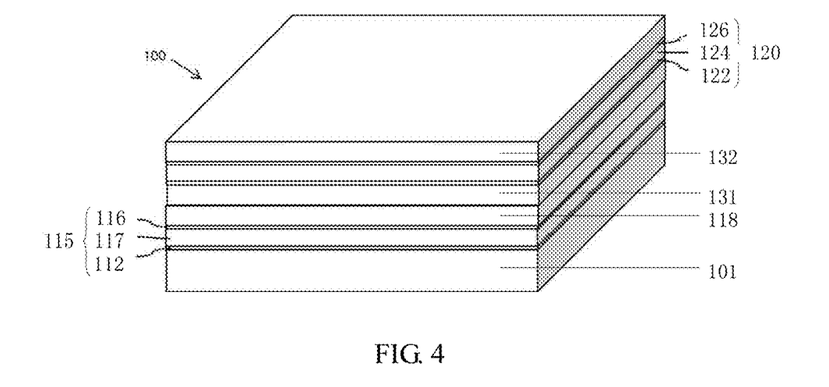
FIG. 4 is a schematic structural perspective view of the display panel provided by an embodiment of the present disclosure.

FIG. 3 is a schematic structural view of the display panel provided by an embodiment of the present invention. FIG. 4 is a schematic structural perspective view of the display panel provided by an embodiment of the present invention. As shown in FIGS. 3 and 4, the display panel further includes: a first antireflection film 131 disposed between the external microcavity structure 120 and the light emitting element 110. The first antireflection film 131 can prevent the light emitted from the light emitting element 110 from being emitted to the light emitting element 110 after being reflected by the first transflective layer 122 of the external microcavity structure 120, prevent the reflected light from affecting the display of the display panel, and then improve the display quality of the display panel.

For example, in some examples, as shown in FIGS. 3 and 4, the display panel further includes: a second antireflection film 132 disposed on a side of the external microcavity structure 120 away from the light emitting element 110. The second antireflection film 132 can prevent ambient light from being emitted to the observer after being reflected by the second transflective layer 126 of the external microcavity structure 120, prevent the reflected light from affecting the display of the display panel, and further improve the display quality of the display panel.

Figure 5:
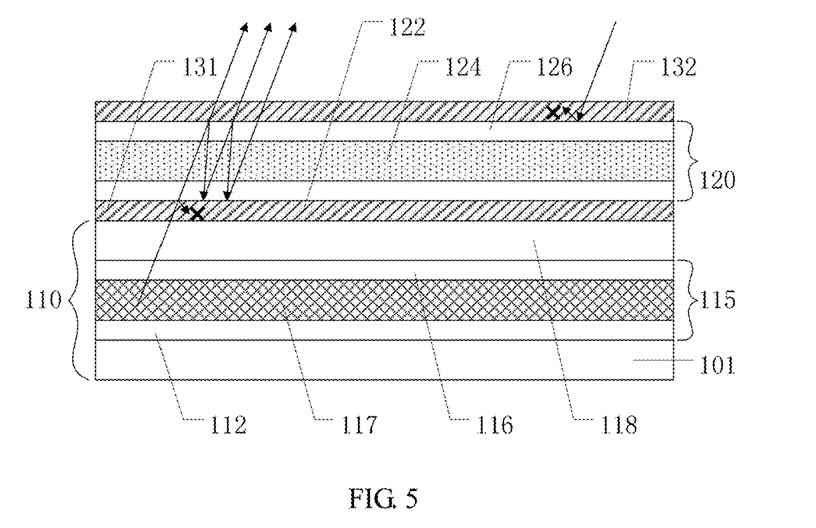
FIG. 5 is a schematic diagram illustrating the anti-reflection principle of the display panel provided by an embodiment of the present disclosure.

FIG. 5 is a schematic diagram illustrating the antireflection of the display panel provided by an embodiment of the present invention. As shown in FIG. 5, the first anti-reflective film 131 is disposed between the external microcavity structure 120 and the light emitting element 110; one part of the light emitted by the light emitting element 110 runs through the first transflective layer 122 of the external microcavity structure 120 and is emitted into the external microcavity structure 120 and modulated by the external microcavity structure 120; and the other part of the light emitted by the light emitting element 110 is reflected by the first transflective layer 122 of the external microcavity structure 120 and emitted to the light emitting element 110. In this case, the first antireflection film 131 can absorb the reflected light, thereby avoiding the reflected light from affecting the display of the display panel and improving the display quality of the display panel.

In another aspect, ambient light is reflected by the second transflective layer 122 of the external microcavity structure 120 and emitted to the observer. If the reflected light is processed, the reflected light will be incident into the eyes of the observer, thereby generating adverse effect on the display of the display panel. In this case, the second antireflection film 132 can absorb the reflected light, avoid the reflected light from affecting the display of the display panel, and further improve the display quality of the display panel.

Figure 6:
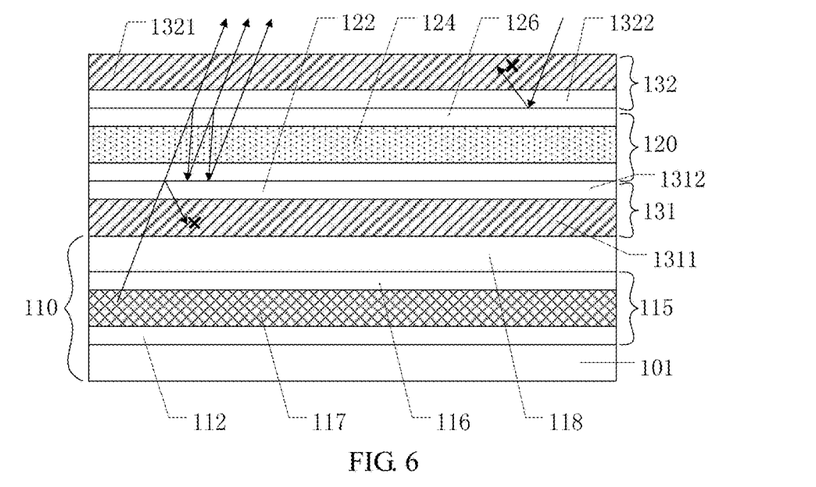
FIG. 6 is a schematic structural view of another display panel provided by an embodiment of the present disclosure.

FIG. 6 is a schematic structural view of the display panel provided by an embodiment of the present invention. As shown in FIG. 6, the first antireflection film 131 includes a first line polarizer 1311 and a first quarter-wave plate 1312 which are stacked, and the first line polarizer 1311 is disposed on a side of the first antireflection film 131 close to the light emitting element 110. That is to say, the light emitted by the light emitting element 110 runs through the first line polarizer 1311 and become linearly polarized light with first polarization direction at first; subsequently, the linearly polarized light with the first polarization direction runs through the first quarter-wave plate 1312 and is converted into circularly polarized light with a first rotation direction; one part of the circularly polarized light with the first rotation direction becomes circularly polarized light with a second rotation direction after being reflected by the first transflective layer 122 of the external microcavity structure 120; the circularly polarized light with the second rotation direction runs through the first quarter-wave plate 1312 and is converted into linearly polarized light with a second polarization direction, and the second polarization direction is perpendicular to the first polarization direction; and finally, the linearly polarized light with the second polarization direction is absorbed by the first line polarizer 1311 because the polarization direction thereof (the second polarization direction) is perpendicular to the first polarization direction, so as to prevent the light emitted by the light emitting element 110 from being emitted to the light emitting element 110 after being reflected by the first transflective layer 122 of the external microcavity structure 120, thereby preventing the reflected light from affecting the display of the display panel and improving the display quality of the display panel.

For example, as shown in FIG. 6, the second antireflection film 132 includes a second line polarizer 1321 and a second quarter-wave plate 1322 which are stacked; the second line polarizer 1321 is disposed on a side of the second antireflection film 132 away from the light emitting element 110; and the polarization direction of the first line polarizer 1311 is the same with the polarization direction of the second line polarizer 1321. Thus, the ambient light runs through the second line polarizer 1321 and become linearly polarized light with first polarization direction at first; subsequently, the linearly polarized light with the first polarization direction runs through the second quarter-wave plate 1322 and is converted into circularly polarized light with a first rotation direction; one part of the circularly polarized light with the first rotation direction become circularly polarized light with a second rotation direction after being reflected by the second transflective layer 126 of the external microcavity structure 120; the circularly polarized light with the second rotation direction runs through the second quarter-wave plate 1322 and is converted into linearly polarized light with a second polarization direction, and the second polarization direction is perpendicular to the first polarization direction; and finally, the linearly polarized light with the second polarization direction is absorbed by the second line polarizer 1321 because the polarization direction thereof (the second polarization direction) is perpendicular to the first polarization direction, thereby preventing the reflected light from affecting the display of the display panel and improving the display quality of the display panel.

It should be noted that the abovementioned first antireflection film and the abovementioned second antireflection film may also adopt other structures capable of realizing the antireflection function, and the present disclosure is not limited herein.

Figure 7A:
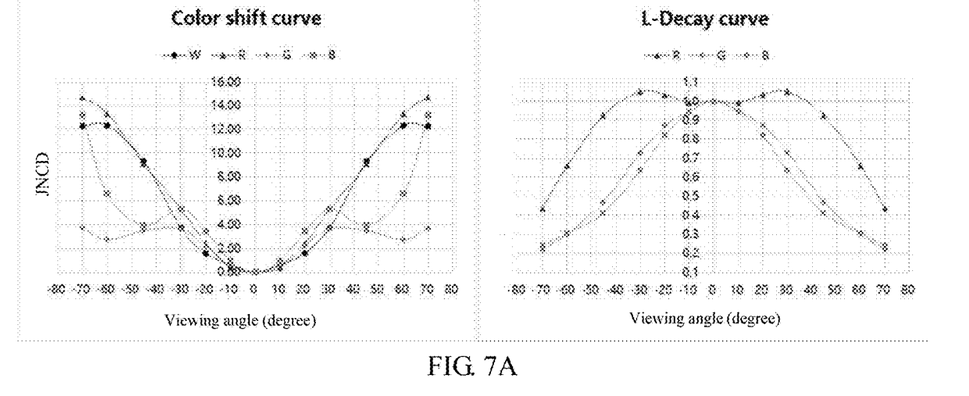
FIG. 7A is a W-color shift curve of an actually measured RGBW-color shift curve and an RGB luminance decay (RGB-L-decay) curve of a conventional display panel.
Figure 7B:
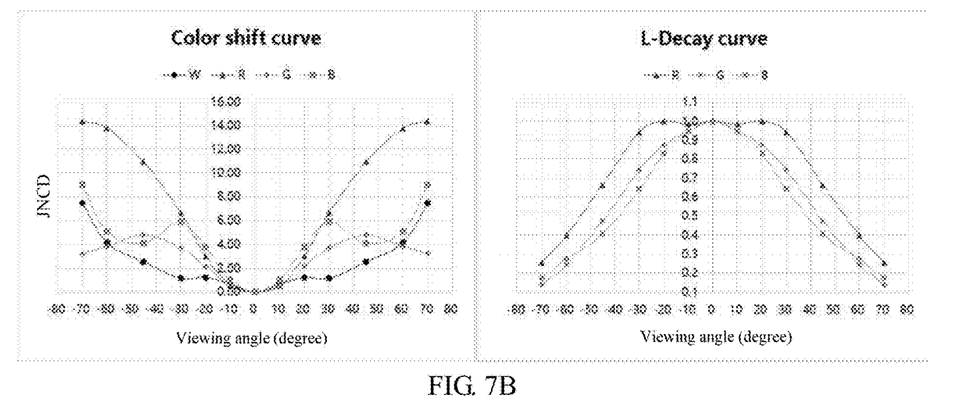
FIG. 7B is a W-color shift curve of a simulated RGBW-Color shift curve and an RGB-L-decay (RGB-L-decay) curve of the display panel provided by an embodiment of the present disclosure.

For example, FIG. 7A is a W-color shift curve an actually measured RGBW-color shift curve and an RGB-L-decay curve of the conventional display panel. FIG. 7B is a W-color shift curve of a simulated RGBW-Color shift curve and an RGB-L-decay curve of the display panel provided by an embodiment of the present invention. The light emitting element of the display panel is the same with that of the display panel as shown in FIG. 7A. The first antireflection film of the display panel adopts the first line polarizer and lithium fluoride (LiF) with a thickness of 100 nm; the second antireflection film adopts the second line polarizer and LiF with a thickness of 230 nm; and the microcavity structure adopts two silver films with a thickness of 5 nm and LiF with the thickness of 320 nm disposed between the two silver films. It should be noted that the example adopts Setfos software for simulation.

As shown in FIGS. 7A and 7B, in the conventional display panel, the white color is heavily reddish along with the increase of the viewing angle. But the color shift of the white color of the display panel provided by an embodiment of the present invention has been obviously improved. Table 1 is a comparison chart of the color shift conditions of the white color of the conventional display panel and the display panel provided by an embodiment of the present invention. As shown in Table 1, upon the viewing angle range being 0-20°, the color shift of the white color of both the conventional display panel and the display panel provided by an embodiment of the present invention is relatively slight, and at this point, the microcavity structure of the light emitting element can modulate the spectrum of the light emitted by the light emitting layer and the modulation effect is good. Upon the viewing angle range being 20-60°, the color shift of the white color of the conventional display panel is relatively large, but the color shift of the white color of the display panel provided by an embodiment of the present invention has been obviously improved due to the function of the external microcavity structure. It should be noted that JNCD in the table is an abbreviation of just noticeable color difference and is used to reflect the degree of color shift.

TABLE 1

| Viewing Angle | An Embodiment of the present disclosure | | | Conventional Display Panel | | |
|---|---|---|---|---|---|---|
| | x | y | JNCD | x | y | JNCD |
| 0 | 0.2982 | 0.3124 | 0.0 | 0.2982 | 0.3124 | 0.0 |
| 10 | 0.2975 | 0.3085 | 0.6 | 0.2988 | 0.3091 | 0.6 |
| 20 | 0.2985 | 0.3055 | 1.2 | 0.3040 | 0.3075 | 1.6 |
| 30 | 0.3028 | 0.3095 | 1.1 | 0.3180 | 0.3111 | 3.7 |
| 45 | 0.3113 | 0.3252 | 2.5 | 0.3523 | 0.3231 | 9.3 |
| 60 | 0.3226 | 0.3268 | 4.1 | 0.3735 | 0.3422 | 12.3 |
| 70 | 0.3434 | 0.3314 | 7.5 | 0.3737 | 0.3569 | 12.3 |

Figure 8:
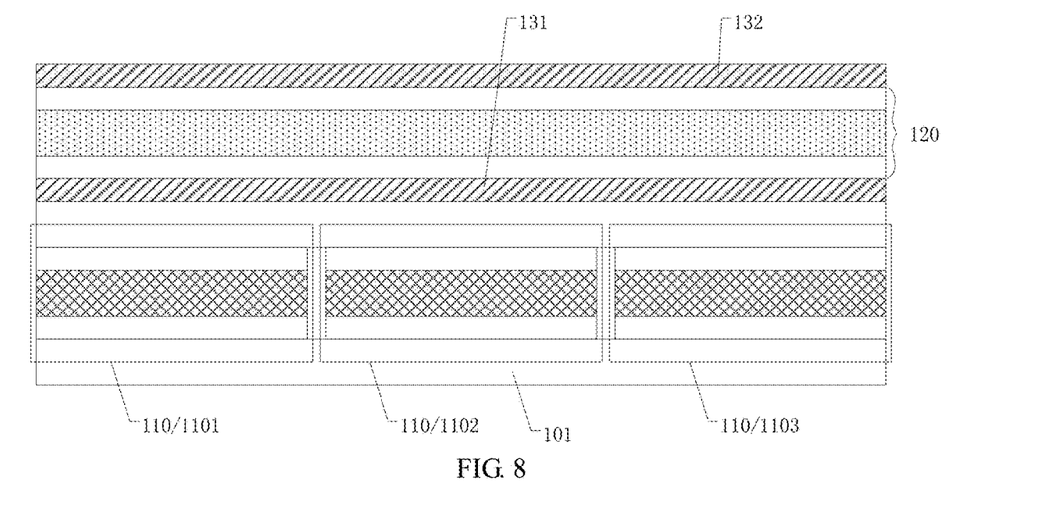
FIG. 8 is a schematic structural view of another display panel provided by an embodiment of the present disclosure.

FIG. 8 is a schematic structural view of a display panel provided by an embodiment of the present invention. As shown in FIG. 8, the light emitting element 110 may include a plurality of light emitting elements 110, the plurality of light emitting elements 110 being configured to respectively emit light of different colors, e.g., red light emitting element 1101, green light emitting elements 1102 and blue light emitting elements 1103; and the external microcavity structure 120 can be integrally disposed on the light emitting element 110 and meanwhile, modulate the spectrum of the light emitted by the plurality of light emitting elements 110 of different colors. For example, upon the plurality of light emitting elements 110 of different colors displaying white color together, because the spectrum of the light emitted by the light emitting elements of RGB colors will be different at different viewing angles, the tristimulus values XYZ will change, and then the tristimulus values Xw, Yw, Zw of the white color displayed together will change, resulting in color shift, upon the luminance of the blue light emitting element 1103 is reduced compared with the red light emitting element 110 and the green light emitting element 1102, the white image will be yellowish. In this case, the L-Decay curve of blue can be adjusted through the external microcavity structure 120, so the tristimulus values X, Y, Z can be balanced, and then the color shift of the display panel can be improved.

Figure 9:
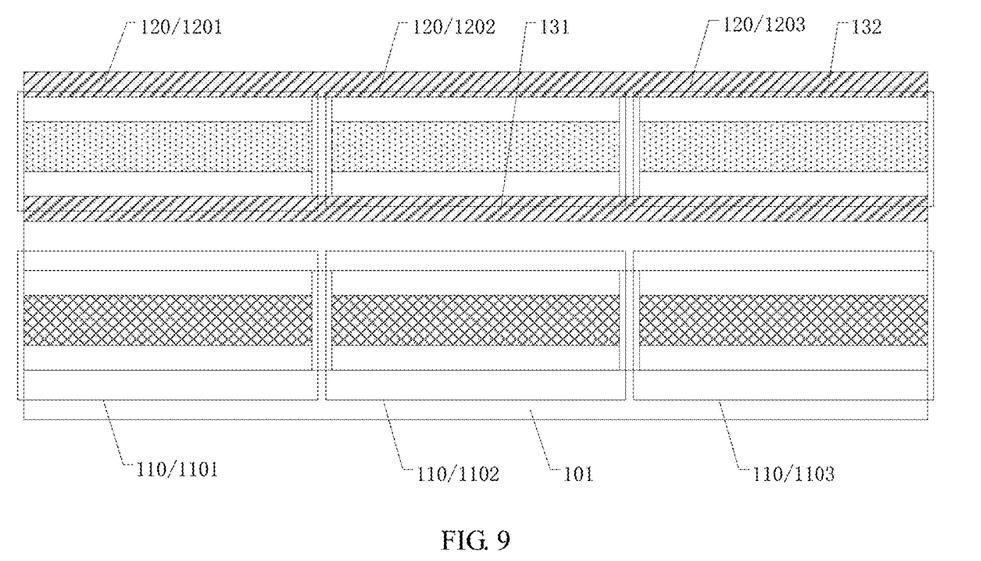
FIG. 9 is a schematic structural view of another display panel provided by an embodiment of the present disclosure.

FIG. 9 is a schematic structural view of another display panel provided by an embodiment of the present invention. As shown in FIG. 9, the light emitting element 110 also includes a plurality of light emitting elements 110, the plurality of light emitting elements 110 being configured to respectively emit light of different colors, For example, red light emitting elements 1101, green light emitting elements 1102 and blue light emitting elements 1103. As different from the display panel as shown in FIG. 8, the external microcavity structure 120 includes a plurality of sub external microcavity structures 1200 in one-to-one correspondence with the plurality of light emitting elements 110 of different colors, so as to respectively modulate the spectrum of the light emitted by the light emitting elements 110 of different colors. That is to say, the plurality of sub external microcavity structures 1200 respectively modulate the spectrum of the light emitted by the light emitting elements 110 of different colors. For example, upon the luminance of the red light emitting element 1101 being reduced within a certain viewing angle range, the correspondingly arranged sub external microcavity structure 1200 can be adopted to modulate the spectrum of the light emitted by the red light emitting element 110, so as to enhance the intensity of red light, thereby weakening and even eliminating the decay of the luminance of the red light emitting element 110 within the certain viewing angle range. Upon the luminance of the green light emitting element 1101 or the blue light emitting element 1103 being reduced within a certain viewing angle range, the correspondingly arranged sub external microcavity structure 1200 can also be adopted to modulate the spectrum of the light emitted by the green light emitting element 1102 or the blue light emitting element 1103, so as to enhance the intensity of green light or blue light, thereby weakening and even eliminating the decay of the luminance of the green light emitting element 1102 or the blue light emitting element 1103 within the certain viewing angle range. Thus, the tristimulus values X, Y, Z can be balanced, and then the color shift of the display panel can be improved.

For example, as shown in FIG. 9, the light emitting element 110 includes: a first color light emitting element 1101, in which a light emitting layer of the first color light emitting element 1101 can emit light of a first color; a second color light emitting element 1102, in which a light emitting layer of the second color light emitting element 1102 can emit light of a second color; and a third color light emitting element 1103, in which a light emitting layer of the third color light emitting element 1103 can emit light of a third color. The external microcavity structure 120 includes a first external microcavity structure 1201 corresponding to the first color light emitting element 1101; a second external microcavity structure 1202 corresponding to the second color light emitting element 1102; and a third external microcavity structure 1203 corresponding to the third color light emitting element 1103.

For example, the first color is red light, the second color is green light, the third color is blue light. Of course, the present invention includes but not limited thereto, and the first color, the second color and the third color may also be other colors.

Figure 10:
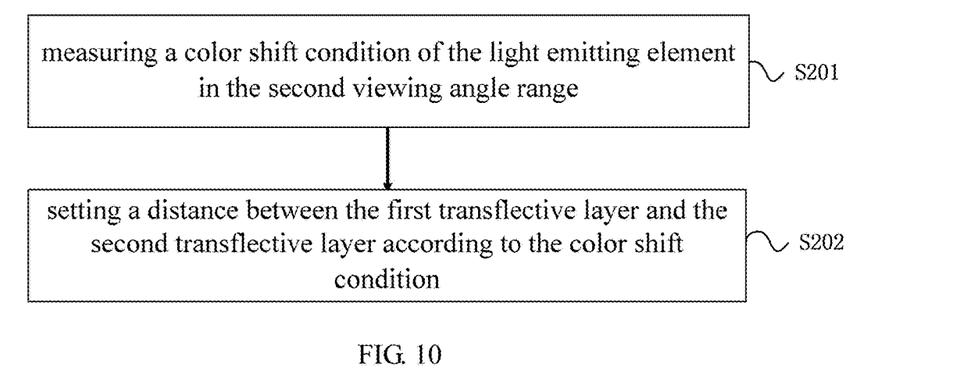
FIG. 10 is a flowchart of a manufacturing method of a display panel, provided by an embodiment of the present disclosure.

At least an embodiment of the present invention further provides a manufacturing method of a display panel. FIG. 10 is a flowchart of the manufacturing method of the display panel, provided by an embodiment of the present invention. The display panel may be the display panel provided by any foregoing example. As shown in FIG. 10, the manufacturing method of the display panel includes the steps S201-S202.

S201: measuring a color shift condition of the light emitting element in the second viewing angle range.

S202: setting a distance between the first transflective layer and the second transflective layer, to adjust the cavity length of the external microcavity structure according to the color shift condition.

In the manufacturing method of the display panel provided by the embodiment, in the second viewing angle range, because the angle formed by the sight line and the normal line of the display panel in the second viewing angle range is increased, the distance between the reflective layer and the transflective layer in the microcavity structure will change, so the modulation effect on the spectrum of the light emitted by the light emitting layer will change, and then color shift can be caused. In this case, the distance between the first transflective layer and the second transflective layer and the cavity length of the external microcavity structure are set according to the color shift condition, so that the additionally arranged external microcavity structure can modulate the spectrum of the light emitted by the light emitting element in the second viewing angle range again, thereby reducing and even eliminating color shift. Thus, the manufacturing method of the display panel can reduce color shift within large viewing angle range (at least in the first viewing angle range and the second viewing angle range) and then can improve the display quality.

It should be noted that the abovementioned light emitting element may include a plurality of light emitting elements, the plurality of light emitting elements being configured to respectively emit light of different colors.

At least an embodiment of the present invention further provides a display device, which includes the display panel provided by any foregoing example. As the display device includes the display panel provided by any foregoing example, the display device has effects corresponding to the beneficial effects of the display panel in the display device, and more detail may refer to relevant description of the display panel provided by the present invention. No further description will be given here.

For example, the display device may be any electronic device with display function such as a mobile phone, a TV, a computer, an in-car display, a navigator or a digital album.

The following statements should be noted:

(1) The drawings accompanying the embodiment(s) of the present disclosure involve only the structure(s) in connection with the embodiment(s) of the present disclosure, and other structure(s) can be referred to common design(s).

(2) In case of no conflict, features in an embodiment or in different embodiments of the present disclosure can be combined with each other.

The above are merely specific implementations of the present disclosure without limiting the protection scope of the present disclosure thereto. Within the technical scope revealed in the present disclosure, modification(s) or substitution(s) may be easily conceivable for those skilled who are familiar with the present technical field, and these modification(s) and substitution(s) all should be contained in the protection scope of the present disclosure. Therefore the protection scope of the present disclosure should be based on the protection scope of the appended claims.

What is claimed is:

1. A display panel, comprising:
   a light emitting element, comprising a microcavity structure and a light emitting layer disposed in the microcavity structure; and
   an external microcavity structure, disposed on a light emitting side of the light emitting element and comprising a first transflective layer, a second transflective layer and a dielectric layer disposed between the first transflective layer and the second transflective layer, wherein
   the microcavity structure of the light emitting element is configured to modulate a spectrum of light emitted by the light emitting layer in a first viewing angle range; the external microcavity structure is configured to modulate a spectrum of light emitted by the light emitting element in a second viewing angle range; and the second viewing angle range is larger than the first viewing angle range.

2. The display panel according to claim 1, wherein a cavity length of the microcavity structure of the light emitting element is different from a cavity length of the external microcavity structure.

3. The display panel according to claim 1, wherein the microcavity structure of the light emitting element is configured to narrow the spectrum of the light emitted by the light emitting layer in the first viewing angle range; and the external microcavity structure is configured to narrow the spectrum of the light emitted by the light emitting element in the second viewing angle range.

4. The display panel according to claim 1, wherein a distance between the external microcavity structure and the microcavity structure of the light emitting element is greater than 1000 nm.

5. The display panel according to claim 1, wherein the light emitting element comprises a first electrode and a second electrode; the first electrode and the second electrode are disposed on both sides of the light emitting layer and configured to drive the light emitting layer to emit light; and at least one of the first electrode or the second electrode is a reflective electrode so as to form the microcavity structure.

6. The display panel according to claim 1, further comprising:
   a first antireflection film, disposed between the external microcavity structure and the light emitting element.

7. The display panel according to claim 6, wherein the first antireflection film comprises:
   a first line polarizer and a first quarter-wave plate, wherein the first line polarizer is disposed on a side of the first antireflection film close to the light emitting element.

8. The display panel according to claim 1, further comprising:
   a second antireflection film, disposed on a side of the external microcavity structure away from the light emitting element.

9. The display panel according to claim 8, wherein the second antireflection film further comprises:
   a second line polarizer and a second quarter-wave plate, wherein
   the second line polarizer is disposed on a side of the second antireflection film away from the light emitting element; and a polarization direction of the first line polarizer is the same with a polarization direction of the second line polarizer.

10. The display panel according to claim 1, wherein the light emitting layer comprises an organic light emitting layer or an inorganic light emitting layer.

11. The display panel according to claim 1, wherein the light emitting element comprises a plurality of light emitting elements, the plurality of light emitting elements being configured to respectively emit light of different colors; and the external microcavity structure comprises a plurality of sub external microcavity structures in one-to-one correspondence with the plurality of light emitting elements of different colors so as to respectively modulate spectrums of light emitted by the plurality of light emitting elements of different colors.

12. The display panel according to claim 11, wherein the light emitting element comprises:
   a first color light emitting element, a light emitting layer of the first color light emitting element being configured to emit light of a first color;
   a second color light emitting elements, a light emitting layer of the second color light emitting element being configured to emit light of a second color; and
   a third color light emitting element, a light emitting layer of the third color light emitting element being configured to emit light of a third color,
   the external microcavity structure comprises a first sub external microcavity structure corresponding to the first color light emitting element, a second sub external microcavity structure corresponding to the second color light emitting element, and a third sub external microcavity structure corresponding to the third color light emitting element.

13. The display panel according to claim 1, wherein a material of at least one of the first transflective layer or the second transflective layer comprises aluminum.

14. The display panel according to claim 13, wherein a thickness of the first transflective layer is 3-7 nm, and a thickness of the second transflective layer is 3-7 nm.

15. The display panel according to claim 1, wherein a thickness range of the dielectric layer is 300-800 nm.

16. A display device, comprising the display panel according to claim 1.

17. A manufacturing method of a display panel, wherein the display panel is the display panel according to claim 1; and
   the manufacturing method comprises:
   measuring a color shift condition of the light emitting element in the second viewing angle range; and
   setting a distance between the first transflective layer and the second transflective layer according to the color shift condition.

18. The display panel according to claim 5, further comprising:
   a first antireflection film, disposed between the external microcavity structure and the light emitting element,
   wherein the first antireflection film comprises:
   a first line polarizer and a first quarter-wave plate, wherein the first line polarizer is disposed on a side of the first antireflection film close to the light emitting element.

19. The display panel according to claim 18, further comprising:

a second antireflection film, disposed on a side of the external microcavity structure away from the light emitting element, wherein the second antireflection film comprises: a second line polarizer and a second quarter-wave plate, the second line polarizer is disposed on a side of the second antireflection film away from the light emitting element; and a polarization direction of the first line polarizer is the same with a polarization direction of the second line polarizer.

20. The display panel according to claim 19, wherein the light emitting element comprises:

a plurality of first color light emitting elements, a light emitting layer of each of the plurality of first color light emitting elements being configured to emit light of a first color;

a plurality of second color light emitting elements, a light emitting layer of each of the plurality of second color light emitting elements being configured to emit light of a second color; and a plurality of third color light emitting elements, a light emitting layer of each of the plurality of third color light emitting elements being configured to emit light of a third color, the external microcavity structure comprises a plurality of first sub external microcavity structures in one-to-one correspondence with the plurality of first color light emitting elements, a plurality of second sub external microcavity structures in one-to-one correspondence with the plurality of second color light emitting elements, and a plurality of third sub external microcavity structures in one-to-one correspondence with the plurality of third color light emitting elements, the first electrode is a reflective layer and the second electrode is a transflective layer.

* * * * *